US011563042B2

(12) United States Patent
Cieslinski

(10) Patent No.: US 11,563,042 B2
(45) Date of Patent: Jan. 24, 2023

(54) IMAGE SENSOR WITH ELECTRICALLY CONDUCTIVE SHIELDING STRUCTURE

(71) Applicant: Arnold & Richter Cine Technik GmbH & Co. Betriebs KG, Munich (DE)

(72) Inventor: Michael Cieslinski, Munich (DE)

(73) Assignee: ARNOLD & RICHTER CINE TECHNIK GMBH & CO. BETRIEBS KG, Munich (DE)

( * ) Notice: Subject to any disclaimer, the term of this patent is extended or adjusted under 35 U.S.C. 154(b) by 0 days.

(21) Appl. No.: 17/239,753

(22) Filed: Apr. 26, 2021

(65) Prior Publication Data

US 2021/0335870 A1 Oct. 28, 2021

(30) Foreign Application Priority Data

Apr. 28, 2020 (DE) .......................... 102020111562.8

(51) Int. Cl.
*H01L 27/146* (2006.01)
*H04N 5/3745* (2011.01)

(52) U.S. Cl.
CPC .. *H01L 27/14612* (2013.01); *H01L 27/14623* (2013.01); *H04N 5/3745* (2013.01)

(58) Field of Classification Search
CPC ......... H01L 27/14612; H01L 27/14623; H01L 27/14603; H01L 27/14609; H01L 27/1464; H04N 5/3745; H04N 5/357; H04N 5/374
See application file for complete search history.

(56) References Cited

U.S. PATENT DOCUMENTS

| 6,229,191 B1 | 5/2001 | Cao et al. |
| 6,498,622 B1 | 12/2002 | Nakashiba |

(Continued)

FOREIGN PATENT DOCUMENTS

| DE | 102004036316 A1 | 2/2005 |
| DE | 60029908 T2 | 12/2006 |

(Continued)

OTHER PUBLICATIONS

German Search Report dated May 28, 2021 in connection with German Patent Application No. 102020111562.8.

(Continued)

*Primary Examiner* — Padma Haliyur
(74) *Attorney, Agent, or Firm* — Amster, Rothstein & Ebenstein LLP

(57) ABSTRACT

An image sensor for electronic cameras has a plurality of pixels for generating exposure-dependent signals, wherein a respective pixel at least comprises: a light-sensitive element to generate electrical charge from incident light; a readout node; a transfer gate to selectively couple the light-sensitive element to the readout node; a converter transistor to convert the charge present at the readout node into a voltage signal at a signal output; and a selection switch that is connected to the signal output of the converter transistor to selectively couple the signal output of the converter transistor to an associated readout line of the image sensor. The respective pixel has an electrically conductive shielding structure that at least partly surrounds the readout node and that is set or can be set to an electrical potential that depends on the voltage signal of the converter transistor.

27 Claims, 11 Drawing Sheets

(56) References Cited

U.S. PATENT DOCUMENTS

Figure 1:
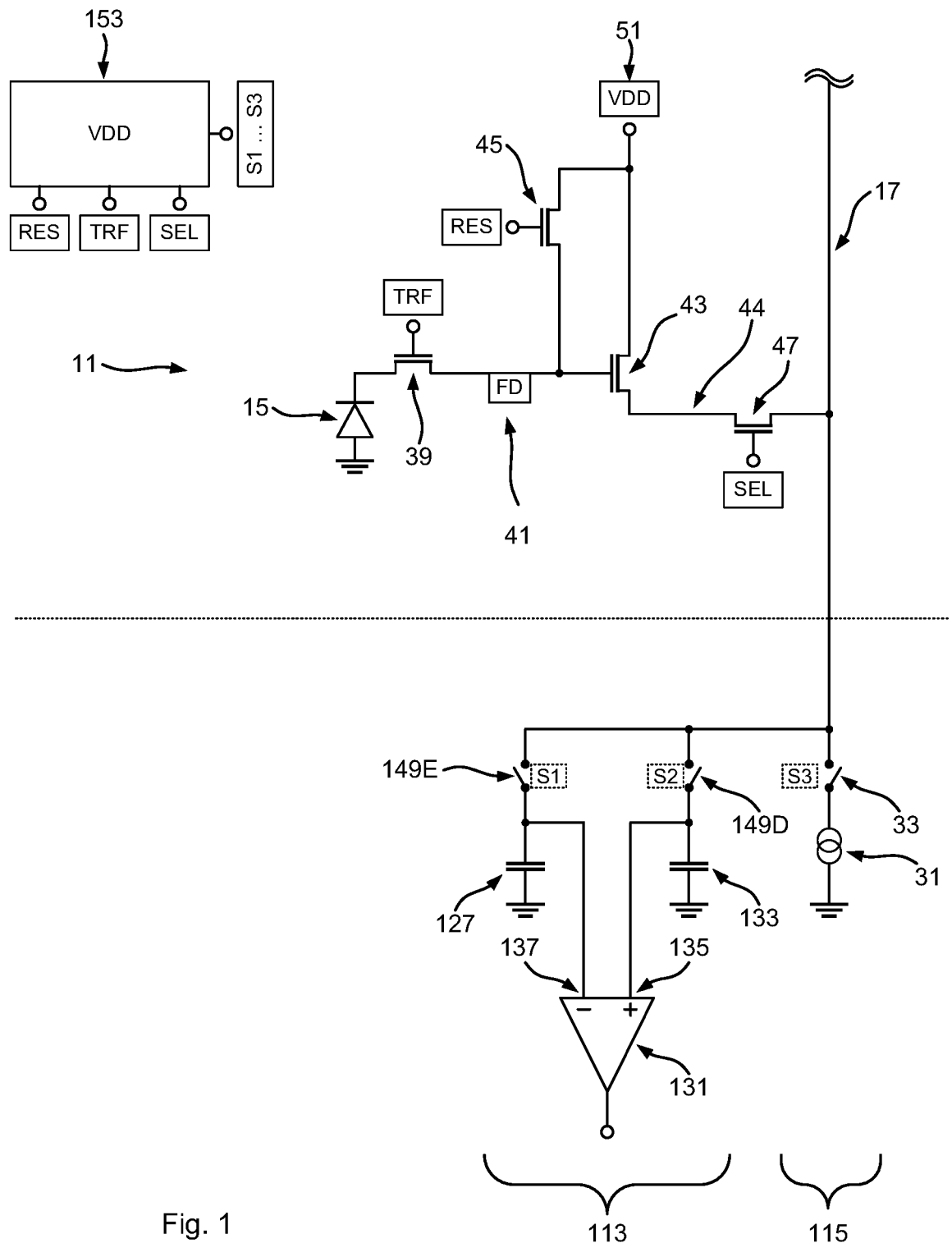

| | | |
|---|---|---|
| 8,102,452 B1 | 1/2012 | Wyatt |
| 8,253,214 B2 | 8/2012 | Guidash |
| 8,872,097 B2 | 10/2014 | Sanson |
| 2005/0023475 A1 | 2/2005 | Li et al. |
| 2008/0054162 A1 | 3/2008 | Fukuda et al. |
| 2008/0210846 A1 | 9/2008 | Andrews et al. |
| 2010/0060764 A1 | 3/2010 | McCarten et al. |
| 2010/0177227 A1* | 7/2010 | Cieslinski .............. H04N 5/378 348/E5.091 |
| 2012/0097842 A1 | 4/2012 | Wan et al. |
| 2013/0082313 A1 | 4/2013 | Manabe |
| 2013/0146749 A1* | 6/2013 | Cieslinski .............. H01L 27/148 250/208.1 |
| 2016/0006965 A1 | 1/2016 | Lee et al. |
| 2016/0028986 A1* | 1/2016 | Kobayashi ........ H01L 27/14643 348/307 |
| 2016/0365380 A1 | 12/2016 | Wan |
| 2019/0124278 A1 | 4/2019 | Velichko |
| 2019/0363115 A1* | 11/2019 | Chuang ............. H01L 27/14636 |

FOREIGN PATENT DOCUMENTS

| | | |
|---|---|---|
| DE | 202018105975 U1 | 1/2019 |
| EP | 0475361 | 3/1992 |
| EP | 1130638 A2 | 9/2001 |
| EP | 2343738 A1 | 7/2011 |
| EP | 2324506 B1 | 5/2013 |
| EP | 2800356 A1 | 11/2014 |

OTHER PUBLICATIONS

European Search Report dated Sep. 21, 2021 in connection with European Patent Application No. 21170637.9.

* cited by examiner

IMAGE SENSOR WITH ELECTRICALLY CONDUCTIVE SHIELDING STRUCTURE

The invention relates to an image sensor for electronic cameras, in particular to a CMOS image sensor, comprising a plurality of pixels for generating exposure-dependent signals.

Electronic cameras are, for example, used as motion picture cameras to record motion picture sequences that are later shown in the cinema. In this respect, it is important that these cameras have a high image quality. In particular, the recorded images are also changed in brightness, contrast, and color during post-production and the end product—the processed motion picture sequence or the film—is projected onto a large screen in the cinema.

Electronic cameras typically use image sensors of silicon in CMOS or CCD technology. In such image sensors, the pixels form an image field and they are arranged in rows and columns. The pixels may be provided with a color filter array (CFA) to have a different spectral sensitivity. Each pixel comprises at least: a light-sensitive element to generate electrical charge from incident light; further a readout node; a transfer gate to selectively couple the light-sensitive element to the readout node and to transfer a generated charge from the light-sensitive element to the readout node; a converter transistor to convert the charge present at the readout node into a voltage signal at a signal output; and a selection switch that is connected to the signal output of the converter transistor via an output line to selectively couple the signal output of the converter transistor to an associated readout line (e.g. a column line) of the image sensor. Thus, the readout node of the pixel is generally formed by the connection between an output of the transfer gate and an input (e.g. a gate terminal) of the converter transistor.

The respective pixel may also comprise a reset switch to selectively couple the readout node to a reset potential. Such an image sensor may further comprise a control device for generating control signals for the respective transfer gate, for the respective selection switch and, if applicable, for the respective reset switch of the pixels to selectively read out image signals (or image signals and reference signals) from the readout node. The converter transistor may form an impedance converter that generates a voltage signal at its signal output in dependence on a charge amount present at its input. The readout lines of the image sensor may be connected to a respective readout amplifier (e.g. a column amplifier, line amplifier) to amplify the voltage signals of the pixels that are successively connected to the associated readout line. A plurality of readout lines of the image sensor may further be connected to a signal bus that leads to one or more output amplifier(s) to amplify the (possibly already pre-amplified) voltage signals of a plurality of readout lines. The pixels of the image sensor are, for example, addressed line by line and the signals of the pixels are conducted to the readout amplifiers at the margin of the image field and from there to the output, are digitized, and are optionally offset with calibration data.

To be able to also record motion picture sequences in poor light conditions and to keep the costs for artificial illumination measures on a film set low, it is desirable for the image sensors of electronic cameras to have a high light sensitivity.

It is the object of the present invention to provide an image sensor having an improved image quality.

The present invention is based on the following considerations.

The light sensitivity is substantially determined by the noise of the image sensor. The noise of the image sensor is substantially composed of the noise of the respective pixel and the noise of the readout path. The noise of the readout path may be reduced to values of e.g. 80 pV by a suitable design such that it only plays a subordinate role compared to the noise of the pixel of e.g. 180 pV.

The noise voltage in the respective pixel is substantially determined by the converter transistor (e.g. a source follower, SF). The noise of the pixel is the ratio between the signal voltage, which an electron causes, and the noise voltage of the converter transistor (SF). To reduce the noise, either the noise voltage of the converter transistor has to be reduced or the signal voltage, which an electron causes, has to be increased.

When a photon is absorbed in the light-sensitive element (e.g. a pinned diode), it creates an electron there. Due to a brief control of the transfer gate of the pixel, this electron is transferred to the readout node (e.g. floating diffusion, FD) (wherein a plurality of photoelectrically generated electrons are typically transferred in a readout process). The charge of this respective electron acts on the capacitance of the readout node (FD) and causes a voltage change there. The capacitance of the readout node is substantially a parasitic capacitance. The voltage change caused by the respective electron is inversely proportional to the capacitance of the readout node. To increase the signal voltage caused by an electron and thereby to reduce the noise of the pixel, an attempt may therefore be made to reduce the capacitance of the readout node (FD).

In typical image sensors, the readout node of the respective pixel may have a capacitance of, for example, 1.6 fF (femtofarad), whereby a voltage change of 100 µV per electron is achieved. The capacitance of the readout node (FD) is substantially composed of three components:

(a) capacitance of the FD area;
(b) capacitance of the input (gate) of the converter transistor (SF); and
c) capacitance of the connection from the readout node (FD) to the input (gate) of the converter transistor.

The capacitance a) of the FD area could be reduced more and more in the course of the last years due to a lower dosing of the implants and thus it only has a subordinate portion of the capacitance of the readout node (FD) of, for example, 0.12 fF, corresponding to 7.5%.

In a source-follower transistor, the capacitance b) of the input of the converter transistor is composed of the gate-drain capacitance and the gate-source capacitance. The gate-drain capacitance substantially results from the overlap of the gate with the drain terminal and may e.g. amount to 0.24 fF with an assumed size of the source-follower transistor of 0.8 µm×1.1 µm. The gate-source capacitance is composed of the sum of the capacitances of the gate area and the overlap to the source terminal and may nominally e.g. amount to 3.1 fF with the assumed size of the source-follower transistor. Since the source terminal of the source-follower transistor is connected to the readout line (e.g. a column line) on the reading out of the pixel and said readout line follows the charge or the corresponding voltage at the readout node (FD), only a portion of the source capacitance becomes effective. With a voltage amplification (gain) of the source-follower transistor of, for example, 92.3%, only 7.7% of the source capacitance is effective, which corresponds to an effective gate-source capacitance of 0.24 fF. The total effective capacitance b) of the input (gate) of the converter transistor (SF) therefore amounts to 0.48 fF in this example, which corresponds to 30% of the total capacitance of the readout node (FO).

The capacitance c) of the connection from the readout node (FD) to the input (gate) of the converter transistor may typically adopt values of 1 fF and thus dominates the typical capacitance of the readout node (FD) (1.6 fF) with a portion of 62.5%.

To significantly increase the sensitivity of the image sensor, the capacitance of the connection leading from the readout node (FD) to the input (gate) of the converter transistor therefore has to be reduced since this connection has the largest portion of the capacitance of the readout node (FD).

Said object is satisfied by an image sensor having the features of claim 1.

In accordance with the invention, provision is made in an image sensor of said type that the respective pixel has an electrically conductive shielding structure that at least partly surrounds the readout node of the pixel and that is set or can be set to an electrical potential that depends on the voltage signal of the converter transistor.

On the one hand, the shielding structure is permanently or at least temporarily at an electrical potential that varies in accordance with the electrical potential at the signal output of the converter transistor of the respective pixel and, on the other hand, the shielding structure is arranged adjacent to the readout node of the pixel. The shielding structure may in particular be set to a potential corresponding to the voltage signal of the converter transistor during a closing of the selection switch, and in particular also already before the closing of the selection switch while the readout node fills with electrical charge from the light-sensitive element.

The shielding structure may in particular at least partly surround the readout node of the pixel with respect to a top plan view of the respective pixel. The shielding structure may be at least partly arranged within the plane in which the readout node lies in order to partly or completely surround the readout node (or a part thereof). Alternatively or additionally, the shielding structure may be arranged adjacent to the readout node at least partly within a plane offset from the plane of the readout node in order to partly or completely surround the readout node (or a part thereof).

The shielding structure may thus cause the electrical potential in the environment of the readout node (in particular in the environment of the connection from the output of the transfer gate to the input (gate) of the converter transistor) to follow the potential at the signal output of the converter transistor, which depends on the charge in the readout node. The base point of the capacitor formed by the capacitance of the readout node is hereby raised in accordance with the charge present in the readout node. Consequently, the potential difference and thus the effective capacitance of the readout node (FD) are reduced. The signal voltage caused by an electron in the readout node is accordingly increased.

In other words, due to the shielding structure, the electrical potential in the environment of the readout node at least temporarily follows the voltage generated at the signal output of the converter transistor that again depends on the accumulation of charge in the readout node. The predominant portion of the (parasitic) capacitance of the readout node is hereby not effective. With respect to the exemplary values mentioned above, with a gain of the converter transistor or the source-follower transistor of e.g. 92.3%, this means that, with a capacitance of the connection from the readout node (FD) to the input (gate) of the converter transistor of 1 fF, only 0.077 fF becomes effective.

Due to the embedding of the connection from the readout node to the input of the converter transistor into a shielding structure, the nominal capacitance indeed, for example, increases from 1 fF to 2 fF, namely due to the small spacings from the surrounding shielding structure. However, the effective capacitance also reduces significantly when considering this effect, namely to, for example, 0.144 fF (=2× 0.077 fF) due to the connection of the shielding structure to the electrical potential of the signal output of the converter transistor.

The total effective capacitance of the readout node of a pixel with a shielding structure may thus be reduced from 1.6 fF to 0.744 fF (=0.12 fF+0.48 fF+0.144 fF) in the example specified above, that is to 46.5% of the starting value. Consequently, the signal voltage caused by an electron may increase from 100 µV to 215 µV. The noise is thereby effectively more than halved, namely from 1.6 electrons (160 µV noise at 100 µV/e−) to 0.75 electrons. The significantly lower noise results in a substantially increased light sensitivity.

The numerical values mentioned above are to be understood by way of example. The effect achieved by the shielding structure may also be stronger or weaker.

The invention may also be used with a pixel architecture and/or a readout architecture that is/are more complex than mentioned above. For example, an overflow capacitor having an additional transfer gate may be provided within the respective pixel, as will be explained in the following. In some embodiments, the respective pixel may comprise a single light-sensitive element; In other embodiments, the respective pixel may also comprise a plurality of light-sensitive elements that are connected in a couplable manner via a respective transfer gate to a common readout node (FD) (so-called "sharing") and/or that are associated (alternating in time) with a common converter transistor. Furthermore, it is possible that the image sensor has a plurality of readout lines for each column or row of pixels (e.g. a plurality of column lines for each column of pixels) or that a plurality of channels having different gain factors are provided for each pixel.

Where reference is made to an electrical voltage or an electrical potential in connection with the invention, it must be taken into account that the electrical voltage is defined as the difference between a first potential (e.g. a generated or considered potential) and a second potential (e.g. a reference potential). Provided that the respective reference potential is given, the two terms can in this respect ultimately be equivalent or used in an equivalent manner.

Where reference is made in connection with the invention to conductors in the image sensor, electrically conductive connections are to be understood here that may in particular be formed on or within a substrate, for example by metallization or doping.

Further embodiments of the invention will be described in the following.

In some embodiments, the shielding structure may be permanently connected to the signal output of the converter transistor (e.g. a source terminal). In other embodiments, the shielding structure may only be temporarily couplable to the signal output of the converter transistor, in particular by temporarily closing an associated switch. In this respect, a selective coupling of the shielding structure to the signal output of the converter transistor may at least occur during a closing of the selection switch of the respective pixel, and in particular also already before the closing of the selection switch, namely while the readout node is being filled with electrical charge from the light-sensitive element via the transfer gate. The control device of the image sensor (e.g. an internal or external microcontroller) may be configured to control the switches of the image sensor in a corresponding sequence.

In the aforementioned cases, the shielding structure may be directly or indirectly connected or couplable to the signal output of the converter transistor. A direct connection or coupling may in particular be formed by continuous electrical lines within the respective pixel. An indirect connection or coupling to the signal output of the converter transistor may, for example, take place via an associated impedance converter and/or via other, in particular active, electronic components, as will be explained in the following.

For example, the shielding structure may be directly connected to the signal output of the converter transistor, in particular via a connection line, wherein such a connection line may extend completely within the respective pixel or partly also outside the respective pixel.

In some embodiments, the selection switch of the respective pixel may be connected to the signal output of the converter transistor via an output line, wherein the shielding structure may be connected to the signal output of the converter transistor via the output line (and optionally also via a connection line leading to the output line), in particular via only a part of the output line. A direct connection to short conductor paths is hereby possible to set the shielding structure to the electrical potential of the signal output. In such an embodiment, a permanent coupling may in particular be provided, wherein a switchable coupling is, however, generally also possible. In the following, further advantageous embodiments of a compact pixel architecture will be explained, in which the connection line between the shielding structure and the signal output of the converter transistor extends completely within the respective pixel and the readout node comprises a bridge section that is surrounded by the shielding structure. In other embodiments, the shielding structure may be connected or couplable to the signal output of the converter transistor via the total output line (extending between the signal output of the converter transistor and the selection switch), as will be explained in the following.

In some embodiments, the shielding structure may be couplable to the signal output of the converter transistor at least via the associated readout line of the image sensor (e.g. a column line or row line) and via the selection switch of the respective pixel. It is therefore also possible that the electrical potential of the shielding structure follows the electrical potential at the signal output of the converter transistor of the respective pixel via a connection that extends outside the respective pixel. The shielding structure may in particular then be coupled to the signal output of the converter transistor via the readout line when the selection switch of the respective pixel is closed. In this respect, provision may in particular be made that at this point in time—that is while the selection switch of the respective pixel is closed to couple the signal output of the converter transistor to the associated readout line—no selection switch of another pixel associated with this readout line is closed. Mutual influences between the pixels may hereby be prevented, in particular if no further decoupling between the shielding structures of the pixels and the associated readout line is provided.

In such embodiments, that is when the shielding structure may be coupled to the signal output of the respective converter transistor via the associated readout line of the image sensor, the coupling may take place indirectly via an impedance converter. It may hereby be prevented that the capacitance of the readout line (e.g. a column line) is undesirably increased by the connected shielding structures of the associated pixels and the respective voltage signal of the converter transistors or their temporal behavior (e.g. a duration of the transient oscillation) is impaired.

A common impedance converter of this type may be provided for a respective one readout line (e.g. a column line). The impedance converter may, for example, be arranged at the edge of the pixel field. A respective impedance converter may thus in particular be provided for a plurality of or all of the pixels of a column. An input of the impedance converter may be connected to the readout line. Thus, the input of the impedance converter may further be connected to the input of a column readout circuit (e.g. a column amplifier circuit) or of a row readout circuit. At least one section of a connection line from the output of the impedance converter to the respective shielding structure may extend substantially in parallel with and in particular adjacent to the associated readout line (e.g. a column line) and may thus also be used for a mutual decoupling of a plurality of adjacent readout lines during inactive times.

In some embodiments, the impedance converter may be configured as a voltage follower.

In some embodiments, the impedance converter may be configured to amplify the respective input signal, in particular the received voltage signal of the respective converter transistor, to bring about an increased dependence of the electrical potential of the shielding structure on the voltage signal of the converter transistor or on the charge amount in the readout node (FD). The impedance converter may thus be active as a feedback amplifier. A particularly effective shielding effect may hereby be achieved. For example, the impedance converter may have a gain of approximately 108% such that together with a gain of the converter transistor (SF) of, for example, 92%, a total gain of approximately 100% results. The gain of the impedance converter or the feedback amplifier may also be selected as even larger in order to compensate additional portions of the capacitance of the readout node; however, the gain may not be too high so that the system does not become unstable and, for instance, starts to oscillate.

In some embodiments with an impedance converter, such an amplification of the voltage signal of the respective converter transistor may be switchable, and/or the impedance converter may be configured to amplify the voltage signal of the converter transistor with a decreasing gain characteristic (that is with a degressive proportionality between the input signal and the output signal of the impedance converter). Different exposure situations or different charge amounts in the readout node of the respective pixel may hereby be better taken into account, for example, in order to raise the electrical potential of the shielding structure more strongly with small charge amounts in the readout node (stronger dependence on the voltage signal at the output of the converter transistor, lower capacitance of the readout node) than with larger charge amounts in the readout node.

In such embodiments with an impedance converter (in particular also in a configuration as an amplifier), a connection line may be provided between the output of the impedance converter and the respective shielding structure. Such a connection line may be switchable. Provision may in particular be made that the shielding structure may be couplable to an output of the impedance converter via a coupling switch to selectively couple the shielding structure to the output of the impedance converter. In this respect, a first section of the connection line may be used in common for a plurality of pixels (e.g. a plurality or all of the pixels in a column) and a respective second section of the connection line (between the respective coupling switch and the respective shielding structure) is associated with a respective pixel.

In general, the shielding structure may be directly or indirectly couplable to the signal output of the respective converter transistor via a coupling switch so that the electrical potential of the shielding structure follows the voltage signal of the converter transistor only at suitable or necessary times. In some embodiments, such a coupling switch may be controllable together with the selection switch of the respective pixel to selectively couple the shielding structure to the signal output. The coupling switch and the selection switch of the respective pixel may in particular be connected to a common control line. Thus, in a simple control, it may be achieved that the shielding structure is only connected to the output of the impedance converter and acts as a desired shield, but also as a capacitive load, when a voltage signal of the respective pixel is actually read out. Alternatively, a separate control line may, however, also be provided for the coupling switch for an independent control. In all of the mentioned cases, the control of the coupling switch may take place by the already mentioned control device of the image sensor that also generates the necessary control signals for the respective transfer gate, for the respective selection switch and, if applicable, for the respective reset switch of the pixels.

In some embodiments, in particular when the shielding structure is directly or indirectly couplable to the signal output of the respective converter transistor via a coupling switch, the shielding structure may be couplable to an electrical reference potential via a further coupling switch. It may hereby be achieved that the shielding structure, when the further coupling switch is closed, is at a defined fixed potential in order to avoid unwanted influences on the pixel and in particular on the readout node by an undefined or floating electrical potential. The reference potential may in particular be the ground potential or a supply voltage of the image sensor.

In some embodiments, the image sensor and in particular a control device of the image sensor may be configured such that said coupling switch and said further coupling switch are only closed alternatively to one another so that the respective shielding structure is only coupled either (directly or indirectly) to the voltage signal of the converter transistor or to the electrical reference potential.

In some embodiments, the shielding structure may surround the readout node at at least three sides. A significant reduction of the effective capacitance of the readout node may hereby be achieved. The shielding structure may surround the readout node at at least three sides within an arrangement plane in which the readout node is also disposed. In some embodiments, the shielding structure may surround the readout node at four sides within an arrangement plane in which the readout node is also disposed. In some embodiments, the shielding structure may surround the readout node at five or six sides, namely within an arrangement plane in which the readout node is also disposed, and above and/or below the arrangement plane.

In some embodiments, the shielding structure may be circumferentially closed to achieve a particularly great reduction of the effective capacitance of the readout node.

In some embodiments, the shielding structure may have an O shape. The shielding structure may in particular form a shielding ring.

In some embodiments, the shielding structure may be circumferentially open, for example through a slot or another opening, for instance to enable another electrical connection within the pixel through the opening.

The shielding structure may in particular have a C shape or a U shape.

In some embodiments, the shielding structure may extend within a plane, in particular within an arrangement plane in which the readout node is also disposed. However, the shielding structure may also extend within a plane that extends slightly above or below the arrangement plane in which the readout node is disposed.

The shielding structure may be directly or indirectly connected or couplable to the signal output of the converter transistor via a connection line, wherein at least a part of the connection line adjoining the shielding structure extends substantially perpendicular to a plane of extent of the shielding structure. A compact and effective arrangement of the shielding structure may hereby be achieved.

In some embodiments, the shielding structure may be formed by a metal track. The electrical connection of the shielding structure to the output line of the pixel, which connects the signal output of the converter transistor of the pixel to the associated selection switch, may also be formed by a metal track. Such metal tracks may be formed by a respective metallization on the production of the pixel.

In some embodiments, the shielding structure may be formed by a channel ("active") that may in particular be disposed in the plane of the silicon surface or of the semiconductor substrate used and may be permanently electrically conductive. This channel may in particular be directly connected to the signal output (e.g. source terminal) of the converter transistor.

In some embodiments, the respective pixel may comprise a further electrically conductive shielding structure that likewise at least partly surrounds the readout node and that is set or can be set to an electrical potential that depends on the voltage signal of the converter transistor. Thus, the readout node of the respective pixel may be partly surrounded by a first shielding structure and may be partly surrounded by a second shielding structure, in particular in a mutually complementary arrangement, wherein the electrical potential of the first shielding structure and the electrical potential of the second shielding structure may depend in different ways on the voltage signal of the converter transistor. Thus, a particularly robust shielding or reduction of the capacitance of the readout node may be achieved. For example, the first shielding structure may be directly connected to the signal output of the converter transistor, while the second shielding structure may be indirectly connected to the signal output of the converter transistor, for example via the impedance converter explained (in particular in the configuration as an amplifier).

The shielding structure may be designed in a compact pixel architecture in which the connection between the shielding structure and the signal output of the converter transistor is formed completely within the respective pixel.

In some embodiments, the readout node may comprise a bridge section that connects an output of the transfer gate to a gate terminal of the converter transistor, wherein the transfer gate and the converter transistor are disposed in a first plane of the pixel (in particular in a substrate plane or a doping plane) and the bridge section of the readout node is disposed in a second plane of the pixel (in particular a metallization plane) that is offset in parallel relative to the first plane, and wherein the shielding structure comprises a shielding section that is disposed in the second plane of the pixel and that at least partly surrounds the bridge section. If, in such an embodiment, the shielding structure and thus the shielding section are set to a potential that depends on the voltage signal of the converter transistor, an effective shielding of the readout node and thus a reduction of the effective capacitance of the readout node may hereby be achieved on a dense arrangement of the necessary elements of the pixel.

In such embodiments having a shielded, vertically offset bridge section of the readout node, the bridge section may be connected to the output of the transfer gate via a first via that extends perpendicular to the first plane of the pixel, wherein the bridge section is connected to the gate terminal of the converter transistor via a second via that extends perpendicular to the first plane of the pixel.

In such embodiments with a bridge section of the readout node, the bridge section may cross the signal output of the converter transistor to further increase the shielding effect.

The bridge section of the readout node may be formed by a metal track on a semiconductor substrate, while the transfer gate and the converter transistor of the pixel (in particular their current passages, that is the source-drain connections) may be formed by electrically conductive channels in the semiconductor substrate.

In such embodiments with a bridge section of the readout node, the shielding section may form a circumferentially closed ring that laterally surrounds the bridge section within the second plane of the pixel.

The shielding section of the shielding structure extending in the second plane of the pixel may at least partly cover the output of the transfer gate and the signal output of the converter transistor to further increase the shielding effect.

The shielding section of the shielding structure extending in the second plane of the pixel may be electrically connected to the signal output of the converter transistor via a via that extends perpendicular to the first plane of the pixel.

In such embodiments with a bridge section of the readout node, the shielding structure may comprise, in addition to the shielding section extending in the second plane of the pixel, at least one further shielding section that extends in the first plane of the pixel and that is arranged adjacent to the transfer gate and/or to the converter transistor. The shielding effect may hereby also be increased even further.

Such a further shielding section may form an elongate finger that has a free end.

The further shielding section of the shielding structure may extend in parallel with a current passage of the converter transistor. Alternatively or additionally, the further shielding section may extend offset in parallel from and in the same direction as a part of the shielding section disposed in the second plane of the pixel.

In some embodiments, the shielding structure may surround more than half of a path of minimum length that extends from an output of the transfer gate to an input (gate terminal) of the converter transistor In some embodiments, the converter transistor may be configured and coupled to the readout node such that the voltage signal generated at the signal output of the converter transistor (e.g. a source terminal) depends on the charge present in the readout node.

In some embodiments, the image sensor may, as already mentioned, comprise a control device that is at least connected to the transfer gate and to the selection switch of the respective pixel and that is configured to generate control signals for the transfer gate and the selection switch.

In some embodiments, the respective pixel may further comprise a reset switch to selectively couple the readout node to a reset potential. Said control device may be configured to also generate control signals for the reset switch.

In some embodiments, the respective pixel may further comprise an overflow capacitor and a further transfer gate to selectively couple the readout node to the overflow capacitor. The capacitance of the readout node may hereby be selectively temporarily increased to be able to receive large charge amounts from the light-sensitive element at a high exposure. Said control device may be configured to also generate control signals for the further transfer gate.

In some embodiments, the associated readout line may be connected or couplable to a readout amplifier and/or to a signal bus that leads to an output amplifier.

Figure 2:
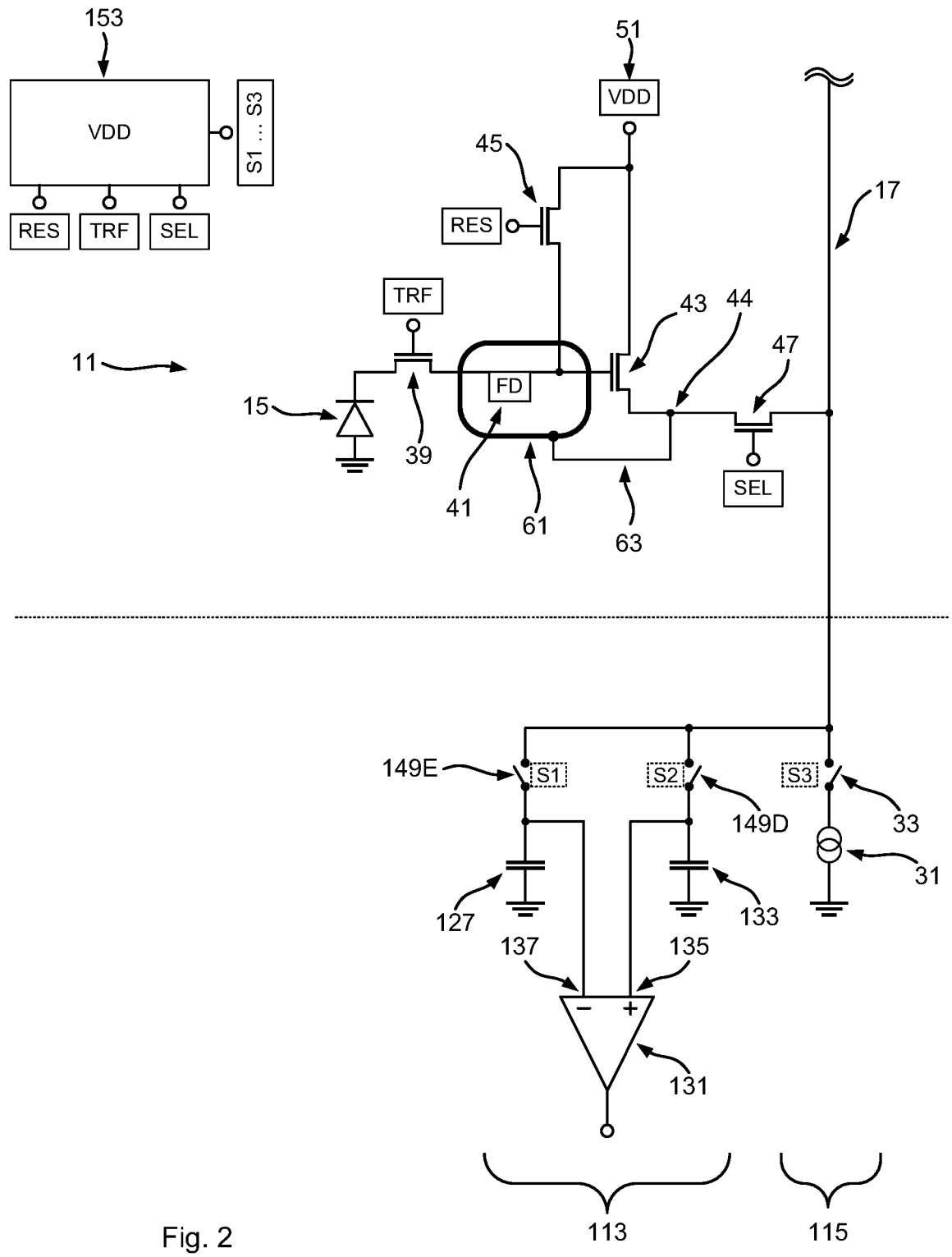
Figure 3:
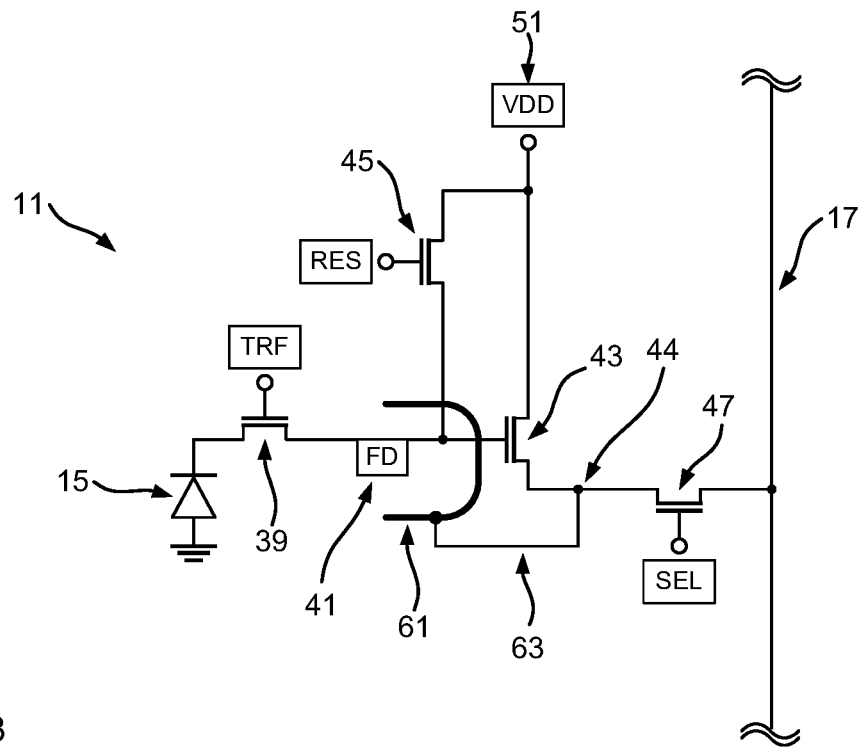
Figure 4:
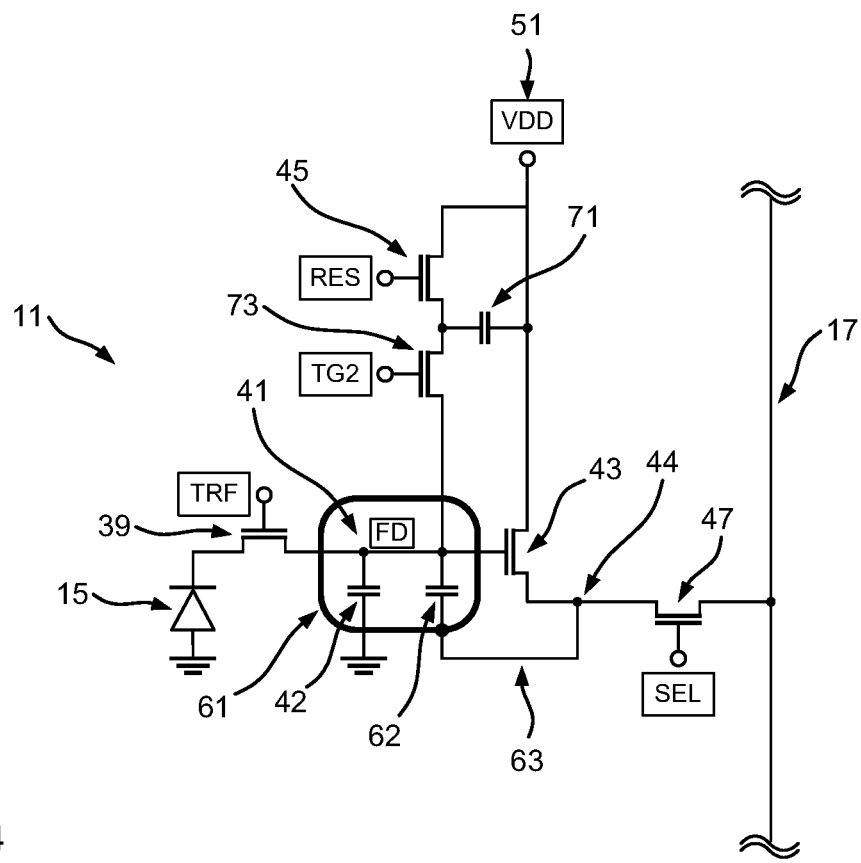
Figure 11:
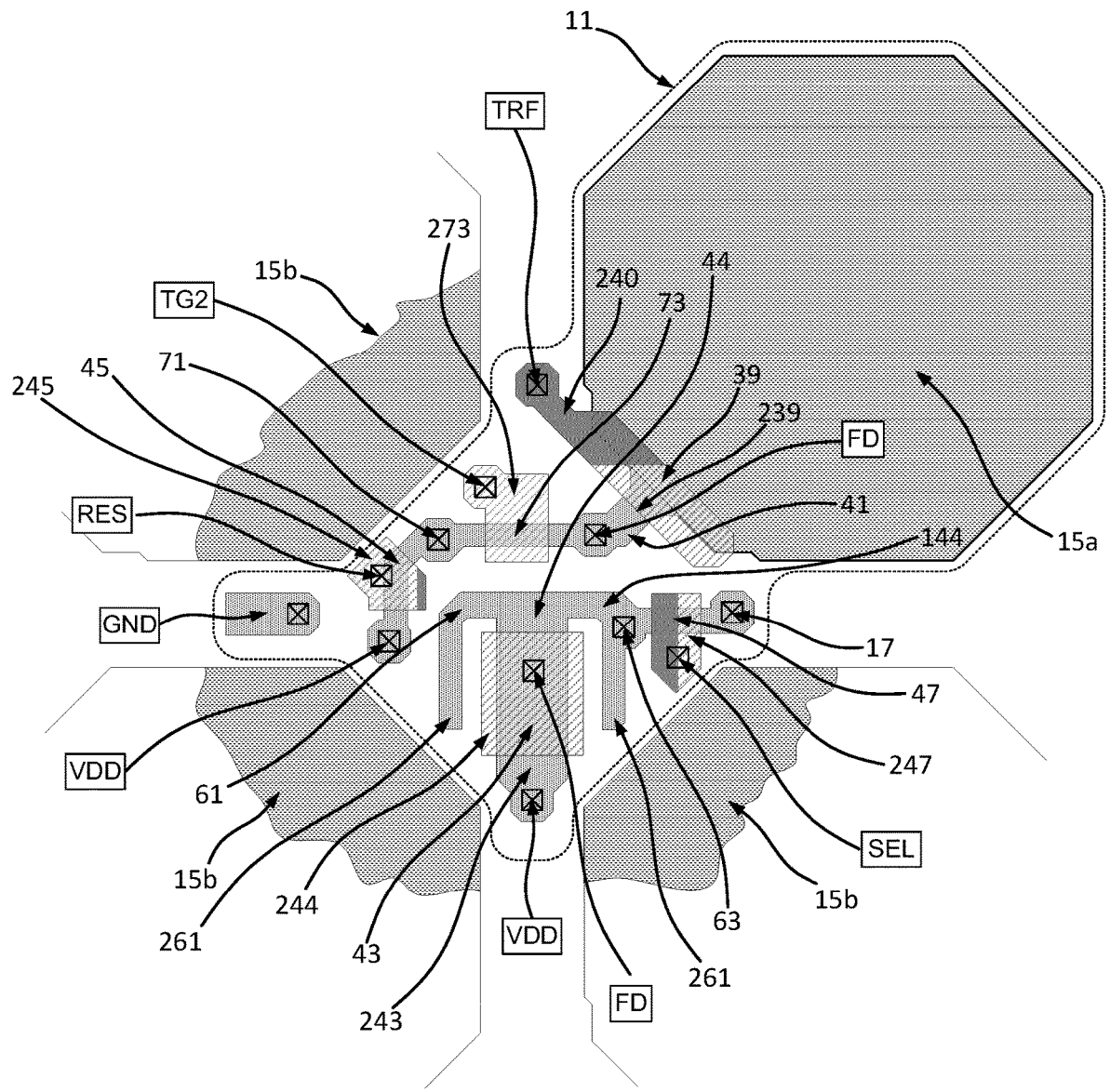

The invention will be described in the following with reference to embodiments and to the drawings, wherein the same or similar elements are characterized by the same reference numerals. There are shown:

FIG. 1 a four-transistor CMOS image sensor in accordance with the prior art; with, of the image sensor, only one pixel and a column amplifier circuit associated with the column line of the pixel being shown;

FIG. 2 an image sensor in accordance with the invention in a manner of representation corresponding to FIG. 1;

FIG. 3 an alternative embodiment of the respective pixel of an image sensor in accordance with FIG. 2;

FIG. 4 a further alternative embodiment of the respective pixel of an image sensor in accordance with FIG. 2 with an additional equivalent circuit diagram of the capacitances;

FIGS. 5 to 10 alternative embodiments of an image sensor in accordance with FIG. 2;

FIG. 11 a top plan view of a first plane of a pixel of an image sensor; and

Figure 12:
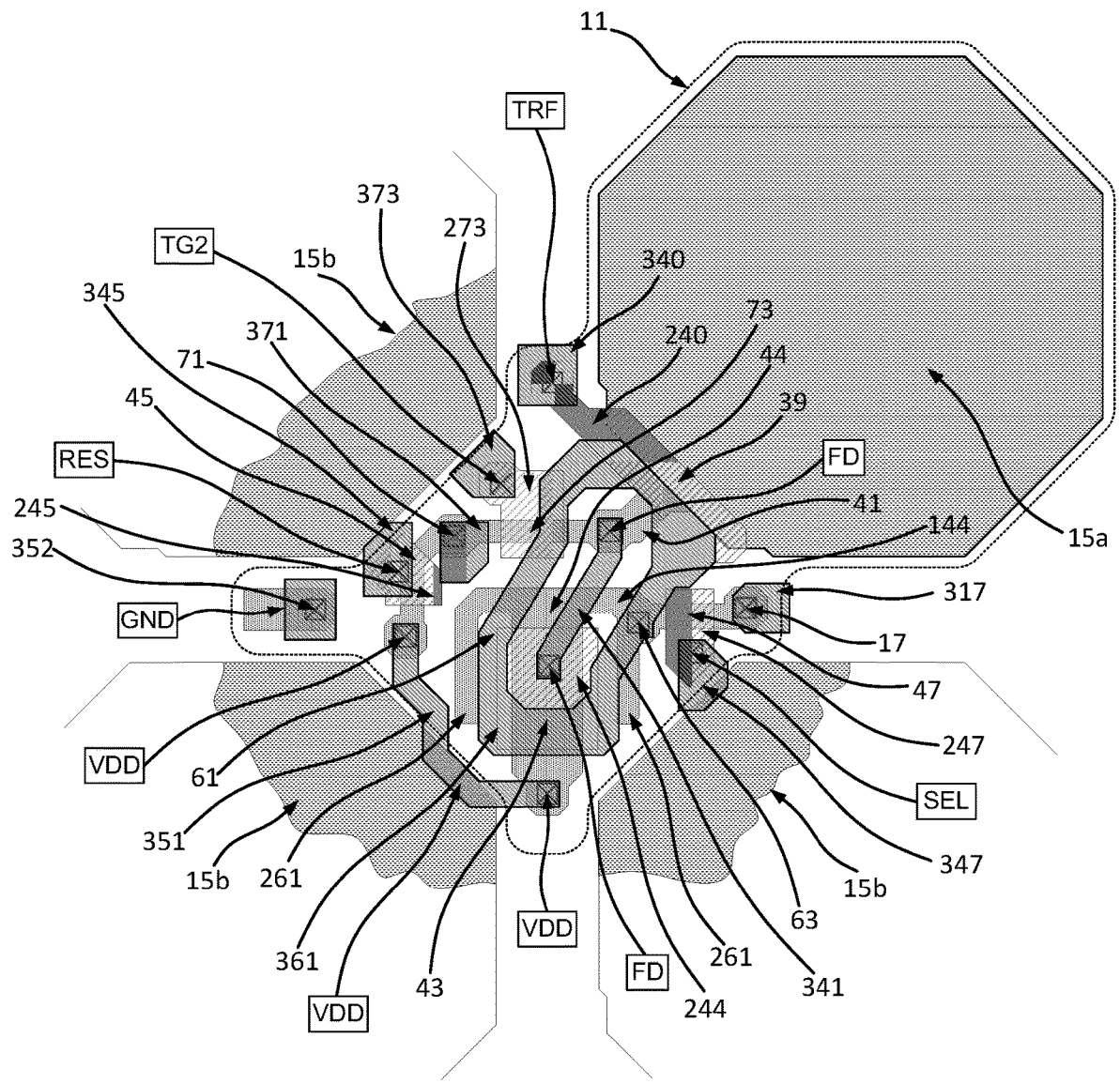

FIG. 12 a top plan view of a second plane of the pixel in accordance with FIG. 11.

The basic operation of an exemplary conventional four-transistor image sensor of the APS (active pixel sensor) type will be explained in the following with respect to FIG. 1 for the better understanding of the invention, with individual components of this image sensor also being present in an image sensor in accordance with the invention. In general, the present invention is, however, not restricted to active four-transistor image sensors, but can rather also be used in image sensors having fewer or more than four transistors per pixel, as will be explained in the following.

Only a single pixel 11 is shown as representative in FIG. 1 that comprises a single light-sensitive element 15 in the form of a photodiode, in particular in the form of a so-called pinned diode. The light-sensitive element 15 may selectively be charge-coupled via a switch in the form of a transfer gate 39 to a readout node 41 that is in particular formed as a so-called floating diffusion (FD).

The readout node 41 is connected to the gate terminal of a converter transistor 43 that is formed as a source follower, that is formed by a field effect transistor (FET), and that represents a charge-to-voltage converter circuit. Furthermore, the readout node 41 is connected to a voltage supply 51 (for example, a positive voltage supply) via a further switching device in the form of a reset switch 45. One of the two channel terminals (drain terminal) of the converter transistor 43 is likewise connected to the positive voltage supply 51, whereas the other of the two channel terminals (source terminal) of the converter transistor 43 forms a signal output 44 at which a voltage signal is output and which is connected to a selection switch 47 via an output line. The selection switch 47 functions as a row selection switch, wherein the signal output 44 of the converter transistor 43 may be selectively coupled to a readout line, which is associated with the represented pixel 11, in the form of a column line 17 by activating or closing the selection switch 47.

The column line 17 is provided to connect the pixels 11 of the same type arranged in an associated column to a common column readout circuit 113, for example to a column amplifier circuit. This alternately takes place by temporarily closing the respective selection switch 47 of the pixels 11.

The column amplifier circuit 113 comprises a first capacitor or a reference value capacitor 127 that is connected to ground by a terminal and that is selectively couplable to the column line 17 by the other terminal via a switch 149E. The column amplifier circuit 113 furthermore comprises a second capacitor or signal value capacitor 133 that is likewise connected to ground by a terminal and that is likewise selectively couplable to the column line 17 by the other terminal via a further switch 149D. The column amplifier circuit 113 furthermore comprises an amplifier 131 at whose negative input 137 the voltage applied to the first capacitor 127 is applied and at whose positive input 135 the voltage applied to the second capacitor 133 is applied.

The transfer gate 39 of the respective pixel 11 is controllable via a control line TRF; the reset switch 45 is controllable via a control line RES; the selection switch 47 is controllable via a control line SEL; the switch 149E is controllable via a control line S1; and the switch 149D is controllable via a control line S2, in each case by a common control device 153 of the image sensor.

A pre-charge circuit 115 is furthermore associated with the column line 17 outside the pixel field of the image sensor (lower part of FIG. 1) and comprises a current source 31 that is selectively couplable to the column line 17 by means of a cut-off switch 33. The control of the cut-off switch 33 takes place by the common control device 153 via a control line S3.

The operation principle of such a pixel 11 will be described in the following by way of example based on a 3.3V CMOS technology. This process is also called "correlated double sampling" (CDS). Typically, all the pixels 11 in a row are read out in the same manner and in particular in parallel so that it is sufficient for the description of the readout process only to look at those pixels 11 that are connected to the same column line.

First, the light incident during an exposure procedure is converted by the light-sensitive element 15 into electrical charge so that the light-sensitive element 15 fills with electrons. During the exposure procedure, the control lines TRF, RES and SEL are each maintained at 0 V, i.e. the switches 39, 45, 47 controlled hereby are open.

Before the actual readout, the cut-off switch 33 is first closed in a pre-charge step and then, after the column line 17 has been set to a defined reference potential (here: ground potential). Parallel to this, a voltage of 3.3 V is briefly applied to the control line RES to remove charge formed by leakage currents and/or by scattered light from the readout node 41, i.e. to delete the readout node 41. The readout node 41 is therefore set to a reference value defined by the voltage supply 51. A voltage is thus adapted at the signal output 44 of the converter transistor 43 that corresponds to the charge at the deleted readout node 41.

In a next step (reading a reference value), a voltage of 3.3 V is applied to the control line SEL so that the selection switch 47 is closed. The switch 149E is additionally closed. The voltage value of the converter transistor 43 corresponding to the charge in the readout node 41 is hereby transferred via the selection switch 47 to the column line 17 and thus to the capacitor 127. After the system has undergone transient oscillation, the selection switch 47 is opened again by a corresponding control signal and the capacitor 127 is simultaneously again cut off from the column line 17 by opening the switch 149E.

Subsequently, in a further pre-charge step, the column line 17 is again pre-charged to the defined reference potential by a brief closing of the cut-off switch 33. In parallel with this, a voltage of 3.3 V is briefly applied to the control line TRF to briefly open the transfer gate 39 or to close the switch that is hereby formed so that the electrons generated in dependence on the exposure can flow from the light-sensitive element 15 to the readout node 41 (transfer step).

In a next step (reading a signal value), the selection switch 47 and the switch 149D are closed. The voltage value of the converter transistor 43 corresponding to the charge in the readout node 41 is hereby transferred via the selection switch 47 to the column line 17 and thus to the capacitor 133. After the system has undergone transient oscillation, the capacitor 133 is again cut off from the column line 17 by opening the switch 149D. The selection switch 47 is also opened and the pixel 11 is cut off from the column line 17 by applying 0 V to the control line SEL.

A voltage is now applied to the output of the amplifier 131 that corresponds to the difference of the voltage values stored in the capacitors 127, 133 and thus to the charge quantity generated in the light-sensitive element 15.

Finally, in a further step, a voltage of 3.3 V is briefly applied to the control lines RES and TRF to remove the charge from the readout node 41 and to remove any residual charge from the light-sensitive element 15 so that the next exposure procedure can again start with a completely "empty" pixel 11.

These steps are also carried out for the further pixels 11 connected to the respective column line 17.

FIG. 2 shows parts of an image sensor in accordance with the invention, wherein a four-transistor image sensor is again illustrated by way of example and only a single pixel 11 is shown as representative even though the image sensor has a plurality of pixels 11 arranged in rows and columns.

A substantial difference from FIG. 1 is that the respective pixel 11 has an electrically conductive shielding structure 61 that surrounds the readout node 41, wherein the shielding structure 61 is set to an electrical potential that is dependent on the voltage signal of the converter transistor 43. For this purpose, in the embodiment of the pixel 11 shown in FIG. 2, the shielding structure 61 is connected via an electrically conductive connection line 63 to the signal output 44 of the converter transistor 43 or to an output line that connects the signal output 44 of the converter transistor 43 to the selection switch 47.

The shielding structure 61 is thus arranged adjacent to the readout node 41 at a plurality of sides of the readout node 41, in particular also adjacent to the connection from the readout node 41 to the input of the converter transistor 43. The shielding structure 61 is not at a fixed potential. Since the shielding structure 61 is connected to the signal output 44 of the converter transistor 43 or of the pixel 11, the electrical potential applied to the shielding structure 61 rather follows the potential or the voltage signal at the signal output 44 of the converter transistor 43 that again depends on the charge collected in the readout node 41.

The potential difference of the capacitor is hereby reduced that is formed by the parasitic capacitance of the readout node 41 and the capacitance of the shielding structure 61 in the environment of the readout node 41. Consequently, the effective capacitance of the readout node 41 is also reduced. The signal voltage that is caused in the readout node 41 by an electron generated by the light-sensitive element 15 increases accordingly ($\Delta U=\Delta Q/C$). Accordingly, the ratio between the signal voltage, which an electron causes, and the noise voltage of the converter transistor 43 improves. The noise of the pixel 11 is hereby reduced and the light sensitivity is increased.

As shown in FIG. 2, the shielding structure 61 may be circumferentially closed, in particular in an annular manner. The shielding structure 61 may substantially have an O shape or may, for example, be polygonal.

FIG. 3 shows an alternative embodiment in which the shielding structure 61 is circumferentially open and surrounds the readout node 41 at only three sides. The shielding structure 61 is substantially U-shaped and is arranged in the environment of the connection from the readout node 41 to the input of the converter transistor 43. However, the shielding structure 61 could also be substantially C-shaped, for example. The U shape shown or said C shape could also be oriented in a different manner, for example in that the open side of the shielding structure 61 faces in the direction of the converter transistor 43 or in the direction of the reset switch 45.

In the embodiments in accordance with FIGS. 2 and 3, the shielding structure 61 may extend within a plane of extent that corresponds to the representation plane of FIGS. 2 and 3 or in parallel with the representation plane of FIGS. 2 and 3. This plane of extent of the shielding structure 61 may correspond to an arrangement plane in which the readout node 41 is also formed. Alternatively thereto, the plane of extent of the shielding structure 61 may also extend slightly above or below the arrangement plane in which the readout node 41 is disposed.

In all of the mentioned cases, the connection line 63 or at least a part of the connection line 63 adjoining the shielding structure 61 (in deviation from the schematic representation in accordance with FIGS. 2 and 3) may extend substantially perpendicular to the plane of extent of the shielding structure 61 or perpendicular to the representation plane of FIGS. 2 and 3 such that the connection line 63 may be kept short and may be well integrated into the present structure of the pixel 11.

The shielding structure 61 and the connection line 63 may be produced in a simple manner by metallizations or permanently conductive channels of the substrate used. The formation of the shielding structure 61 and the connection line 63 may thus be integrated into typical production processes of a pixel 11 in a simple manner.

FIG. 4 illustrates that the shielding structure 61 may, for example, also be provided in a five-transistor image sensor. The respective pixel 11 in accordance with FIG. 4 additionally comprises an overflow capacitor 71 and a further transfer gate 73. The further transfer gate 73 may be selectively controlled by the control device 153 (cf. FIG. 2) via a control line TG2 to couple the readout node 41 to the overflow capacitor 71. The capacitance of the readout node 41 may hereby be selectively temporarily increased to be able to receive large charge amounts, which are generated in the light-sensitive element 15, at a high exposure of the pixel 11. The (temporary) increase of the capacitance of the readout node 41 associated therewith does not have a disadvantageous effect on the light sensitivity insofar as a high signal-to-noise ratio is anyway achieved at a high exposure.

FIG. 4 further illustrates the already mentioned (parasitic) capacitance of the readout node 41, which is shown as a capacitor 42 in the equivalent circuit diagram, and the capacitance of the shielding structure 61 that is shown as the capacitor 62. The overall effective capacitance of the readout node 41 is reduced by the influence of the shielding structure 61 since the base point of the capacitor formed is raised in accordance with the charge in the readout node 41 and the resulting voltage signal at the signal output 44 of the converter transistor 43.

FIGS. 5 to 10 show alternative embodiments of an image sensor comprising pixels 11 in a manner of representation corresponding to FIG. 2.

Figure 5:
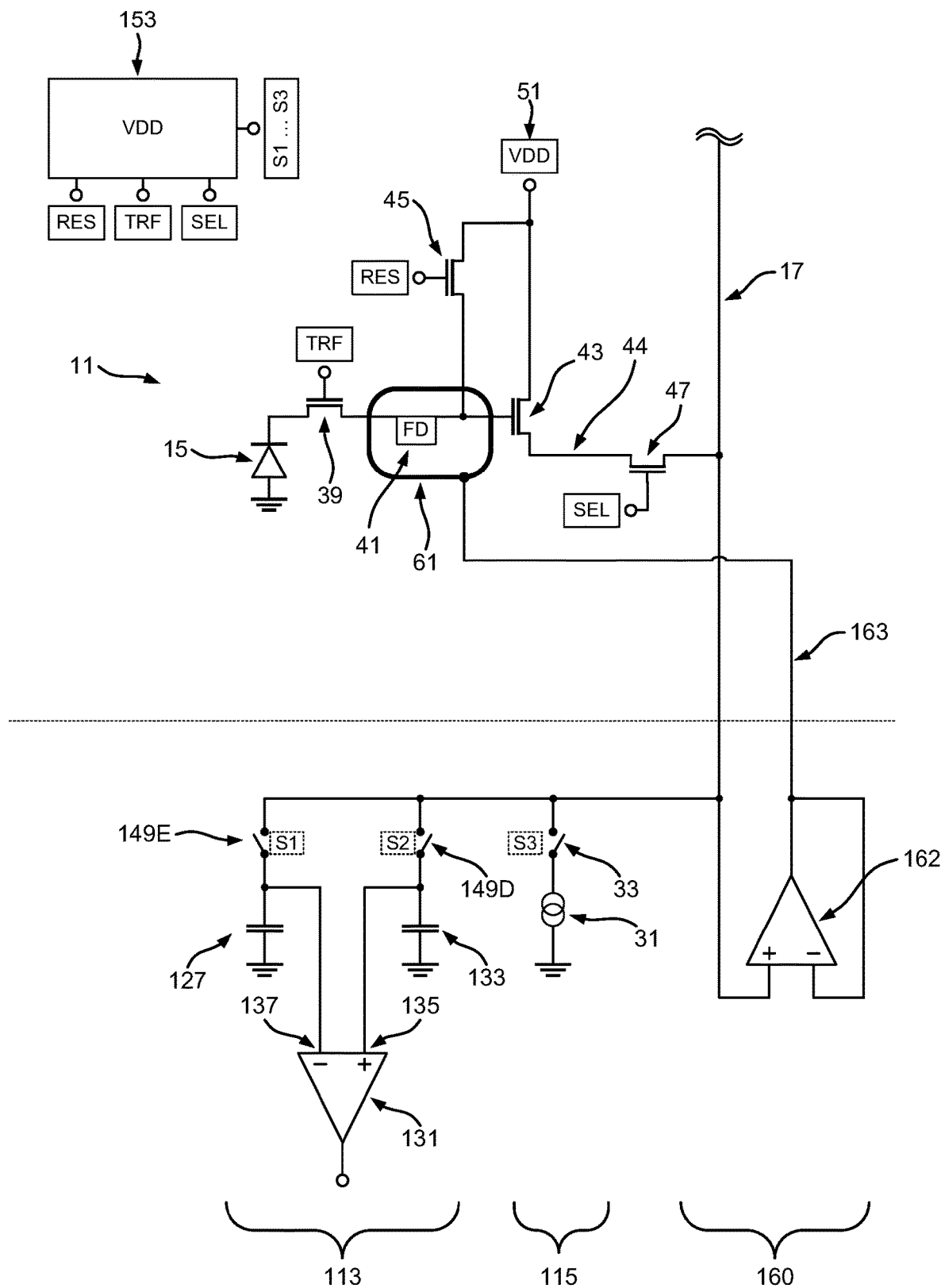

In the embodiment in accordance with FIG. 5, the shielding structure 61 is only indirectly connected to the signal output 44 of the converter transistor 43, namely via the associated readout line or column line 17 and an impedance converter 162. For this purpose, the column line 17 is connected to a positive input of the impedance converter 162. Since this input is of high impedance, the output signals of the associated converter transistors 43 of the pixels 11 of the respective column, which are conducted via the column line 17, are not impaired. The output of the impedance converter 162 is connected to the shielding structure 61 of the respective pixel 11 via a connection line 163. Thus, a common impedance converter 162 is provided for a plurality of pixels 11 (in particular outside the pixel field of the image sensor), wherein a coupling between the signal output 44 of the converter transistor 43 and the shielding structure 61 of the respective pixel 11 may be selectively established via the selection switch 47 of the respective pixel 11.

In such an arrangement, it may be prevented by the impedance converter 162 that the capacitance of the readout line or column line 17 is undesirably increased by the respective shielding structure 61 of the associated pixels 11 and that the voltage signals of the converter transistors 43 that are forwarded via the column line 17 are impaired. The impedance converter 162 thus forms a decoupling circuit 160.

Figure 6:
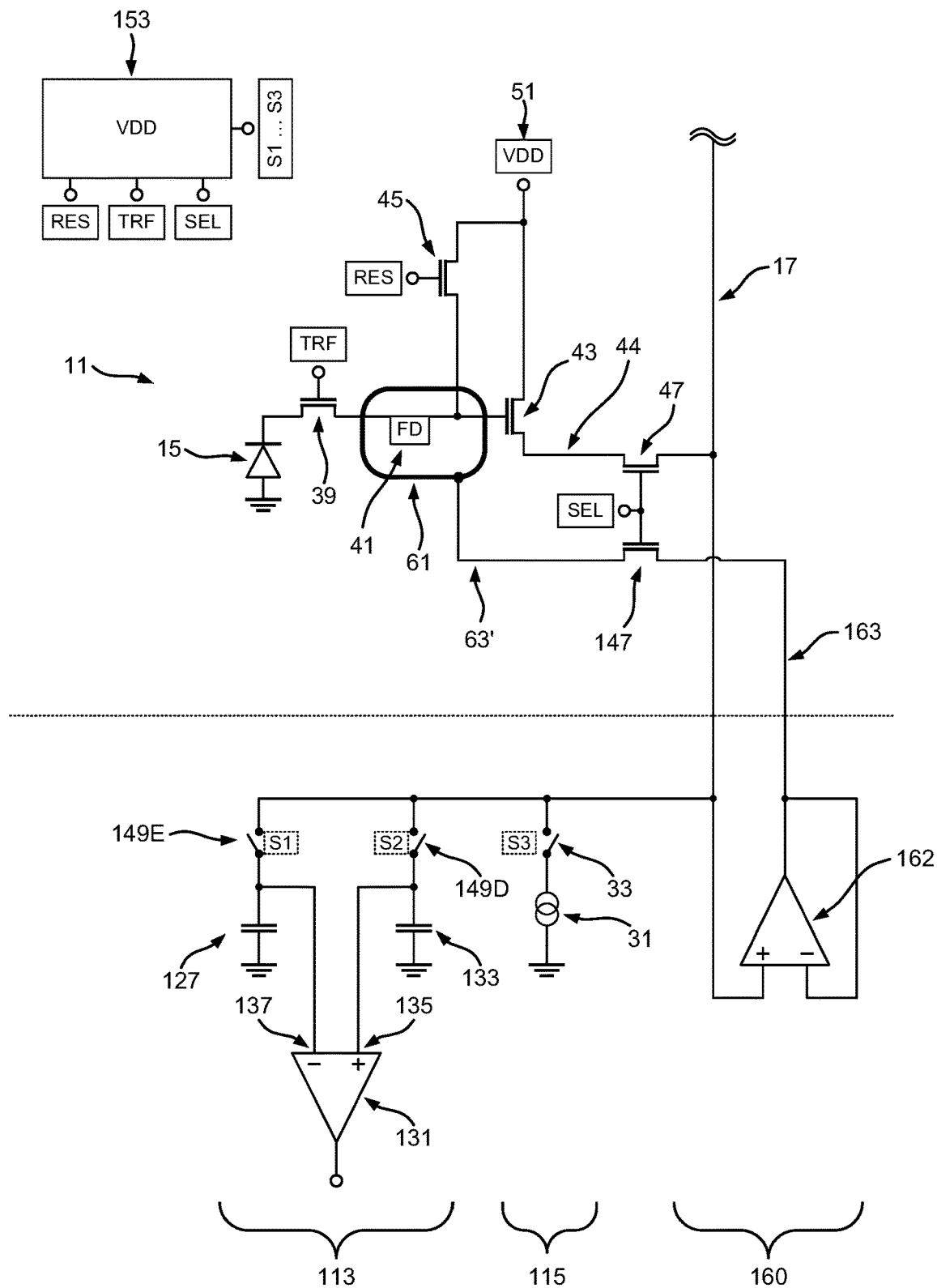

In the embodiment in accordance with FIG. 6, compared to FIG. 5, a respective coupling switch 147 is additionally provided in the connection line 163 between the output of the impedance converter 162 and the shielding structure 61 of the respective pixel 11. The shielding structure 61 is selectively (indirectly, namely via the impedance converter 162) couplable to or decouplable from the signal output 44 of the converter transistor 43 via the coupling switch 147. It is hereby possible to selectively couple the output of the impedance converter 162 to a respective shielding structure 61 only at certain times. Thus, it may, for example, be prevented that the electrical potential of the respective shielding structure 61 is falsified by shielding structures 61 of other pixels 11 connected to the respective shielding structure 61.

The coupling switch 147 separates the connection line between the output of the impedance converter 162 and the shielding structure 61 of the respective pixel 11 into a first section 163 and a second section 63'.

In the embodiment shown in FIG. 6, the coupling switch 147 is controllable together with the selection switch 47 of the respective pixel 11. This may take place in a particularly simple manner by a common control line SEL. It is thus ensured that the respective shielding structure 61 is only connected to the output of the impedance converter 162 and set to an electrical potential corresponding to the voltage signal of the converter transistor 43 when a voltage signal of the respective pixel 11 should actually be read out.

If a coupling switch 147 is provided for the shielding structure 61 of the respective pixel 11 (as shown in FIG. 6, controllable together with the selection switch 47 of the respective pixel 11 or independently controllable), the decoupling circuit 160 or the impedance converter 162 could generally also be dispensed with, i.e. the shielding structure 61 of the respective pixel 11 could be couplable to the signal output 44 of the converter transistor 43 via the coupling switch 147, the associated readout line or column line 17, and the selection switch 47 of the respective pixel 11.

Figure 7:
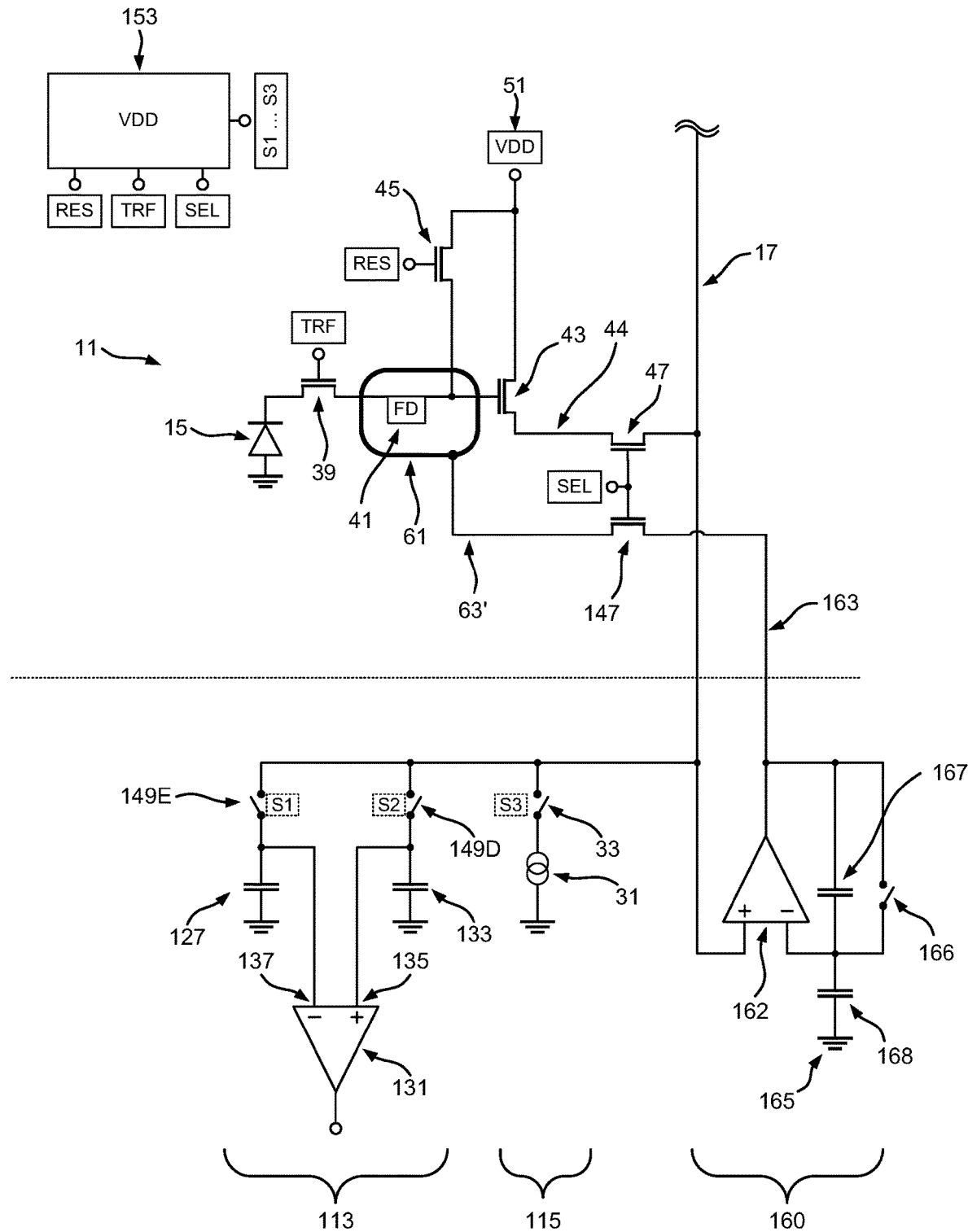

The embodiment in accordance with FIG. 7 differs from the embodiment in accordance with FIG. 6 in that the impedance converter 162 is configured as an amplifier. Two capacitors 167, 168 are shown by way of example in the feedback loop to set the gain factor, wherein a voltage divider against the ground potential 165 by using ohmic resistors is alternatively also conceivable, for example. The feedback capacitor 167 may be bridged by means of a switch 166 to deactivate the gain.

By configuring the impedance converter 162 as an amplifier, the dependence of the electrical potential of the shielding structure 61 on the voltage signal of the converter transistor 43 or on the charge amount in the readout node 41 may be increased. The impedance converter 162 may in particular be configured to amplify the voltage signal of the respective converter transistor 43 with a decreasing gain characteristic.

Figure 8:
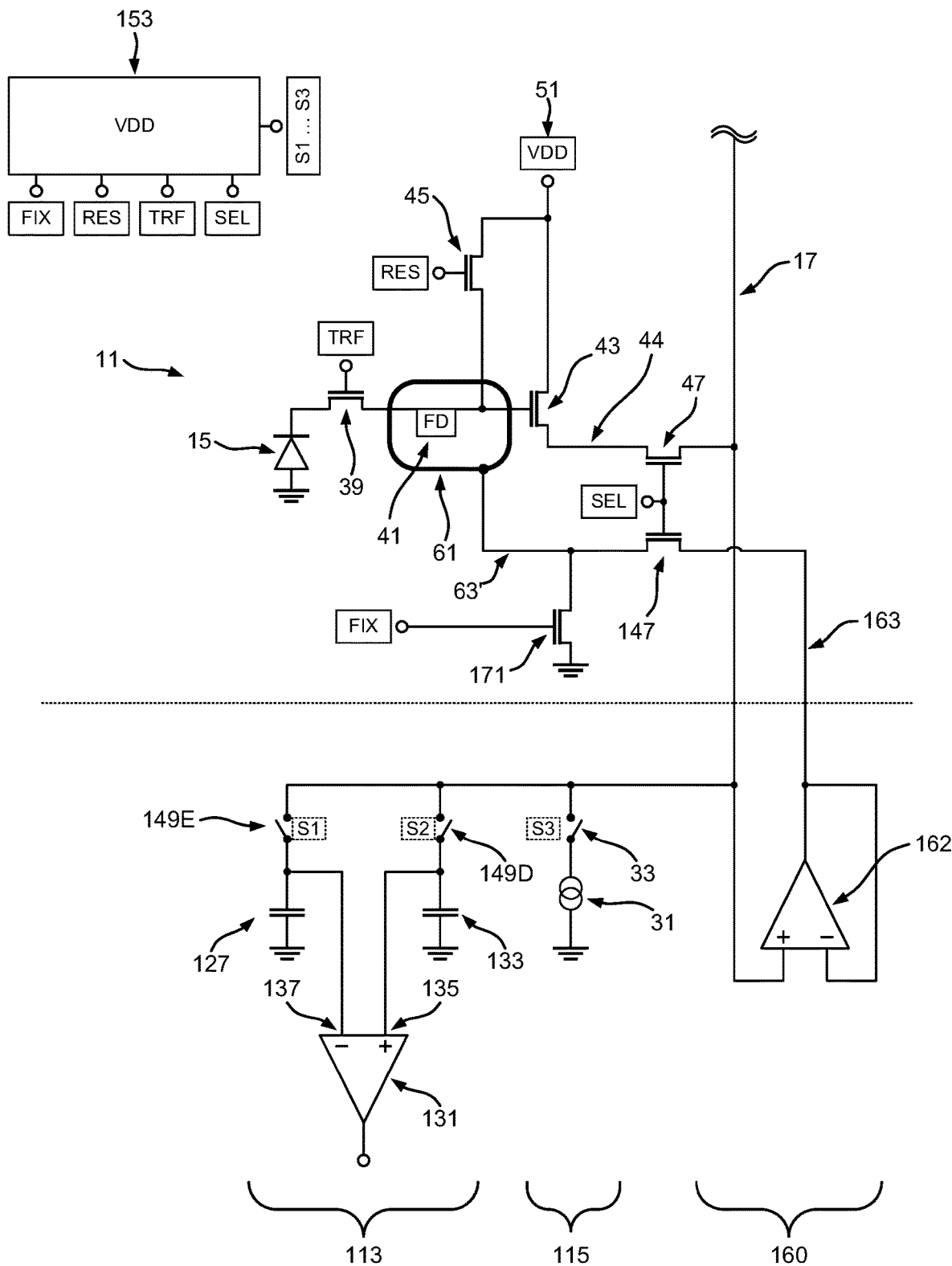

The embodiment in accordance with FIG. 8 differs from the embodiment in accordance with FIG. 6 in that the shielding structure 61 of the respective pixel 11 may be coupled to an electrical reference potential, in particular to the ground potential, via a further coupling switch 171. It may hereby be achieved that, when the further coupling switch 171 is closed, the shielding structure 61 is at a defined fixed potential in order to avoid unwanted influences on the pixel 11 and in particular on the readout node 41 by an undefined electrical potential.

The further coupling switch 171 may be controlled by the control device 153 of the image sensor via a control line FIX. The control device 153 may be configured to only close the selection switch 47 (for a readout of the pixel 11) or to only close the further coupling switch 171 (to keep the electrical potential of the shielding structure 61 constant) at a given point in time.

Figure 9:
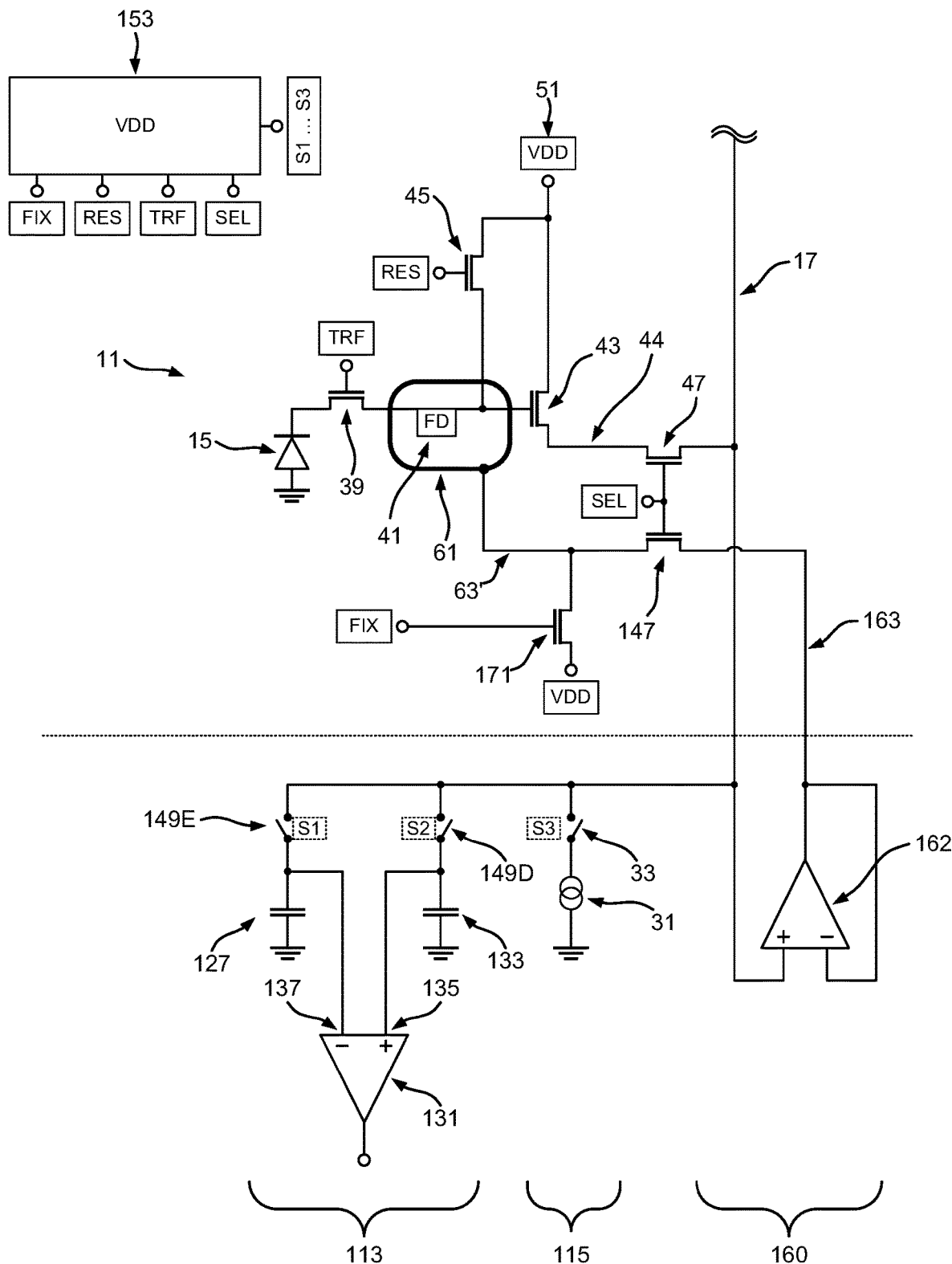

The embodiment in accordance with FIG. 9 corresponds to the embodiment in accordance with FIG. 8, wherein the shielding structure 61 of the respective pixel 11 may be coupled to the supply voltage VDD of the image sensor via the further coupling switch 171.

Figure 10:
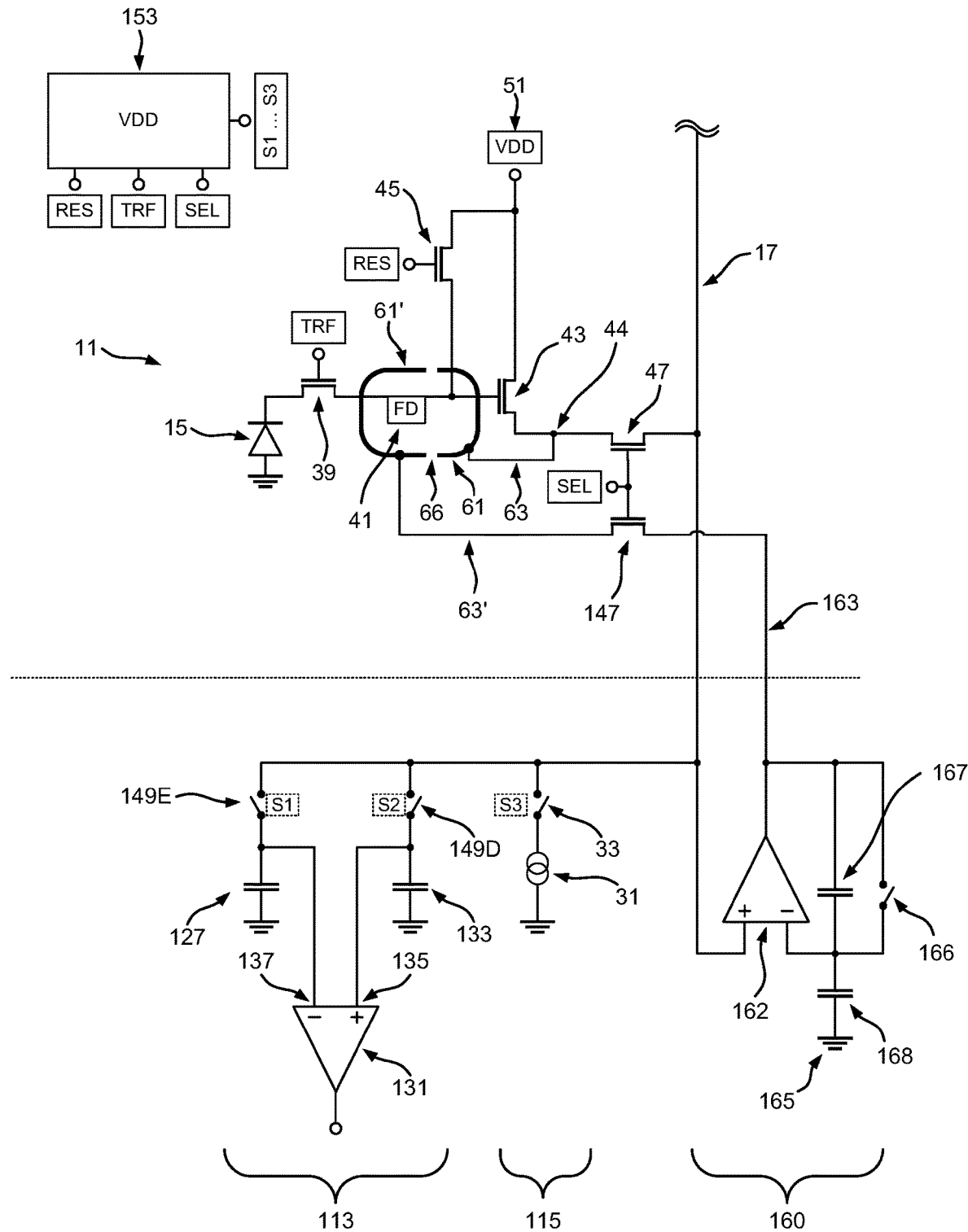

FIG. 10 illustrates that the respective pixel 11 may have a further shielding structure 61' In addition to the shielding structure 61, wherein both shielding structures 61, 61' partly surround the readout node 41. The two shielding structures 61, 61' may, for example, be U-shaped, comprising mutually facing open sides, to substantially form the shape of a slotted ring at an insulating spacing 66.

Both shielding structures 61, 61' may be at an electrical potential that depends on the voltage signal at the signal output 44 of the converter transistor 43, but in different ways. For this purpose, the one shielding structure 61 may, as in the embodiment in accordance with FIG. 2, be directly connected to the signal output 44 of the converter transistor 43 of the respective pixel 11 via a connection line 63. The other shielding structure 61' may, as in the embodiment in accordance with FIG. 7, be couplable via a coupling switch 147 to the output of an impedance converter 162 that is part of a decoupling circuit 160 and whose input is couplable to the signal output 44 of the converter transistor 43 via the readout line or the column line 17 and the respective selection switch 47.

The embodiments explained in connection with FIGS. 2 to 10 may also be combined in another way.

An advantageous embodiment of a pixel 11 having a shielding structure 61 in a compact architecture will be explained in the following with reference to FIGS. 11 and 12.

FIG. 11 shows, in a top plan view, components of a pixel 11 that are arranged in a first, lower plane, wherein the light-sensitive element 15a of the pixel 11 is shown and parts of the light-sensitive elements 15b of adjacent pixels can also be seen. This is a back side illuminated image sensor (BSI), i.e. the exposure takes place from below, against the direction of view. The light-sensitive elements 15a, 15b are octagonal and are arranged adjacent to one another with a respective total of four edges. A high fill factor is hereby achieved within the plane shown.

The further components of the respective pixel 11 are arranged between the remaining four (slanted) edges. The transfer gate 39 can be seen, and indeed with a current passage 239 that is covered by a gate terminal 240 (shown lightly hatched) that is connected to a terminal for the control line TRF. A part of the readout node 41 (floating diffusion, FD) can further be seen. The converter transistor 43 can further be seen. The converter transistor 43 comprises a drain terminal that is connected to the supply voltage 51 at VDD; further a current passage 243; and a source terminal that forms the signal output 44. A gate terminal 244 of the converter transistor 43 is shown lightly hatched. Such "terminals" of the pixel 11 are generally to be understood as functional elements and may be formed by corresponding regions of the pixel 11 (e.g. within the semiconductor substrate) and/or by delineated structures of the pixel 11.

The readout node 41 (floating diffusion, FD) extends up to the upper side of the gate terminal 244 of the converter transistor 43, as will be explained in the following. The signal output 44 of the converter transistor 43 is connected to the selection switch 47 via an output line 144. Thus, the signal output 44 of the converter transistor 43 may be selectively connected to a terminal for the column line 17 via the selection switch 47. For this purpose, a gate terminal 247 (shown lightly hatched) of the selection switch 47 comprises a terminal for the control line SEL. The reset switch 45 can further be seen that selectively connects a terminal VDD for the supply voltage 51 to the readout node 41 (here indirectly via the further transfer gate 73 mentioned in the following). The reset switch 45 comprises a gate terminal 245 (shown lightly hatched) that is connected to the control line RES. A terminal for a ground line GND may further be seen.

Optionally, as explained in connection with FIG. 4, the pixel 11 may have an overflow capacitor 71 (not shown in FIGS. 11 and 12) that may be selectively connected to the readout node 41 via a further transfer gate 73, wherein the further transfer gate 73 has a gate terminal 273 (shown lightly hatched) that has a terminal for the control line TG2.

The components of the pixel 11 shown in FIG. 11 and listed above are arranged substantially within a common plane. The electrical connections shown, in particular the current passage 239 of the transfer gate 39 and the current passage 243 of the converter transistor, may be formed by a doping of the semiconductor substrate used (e.g. silicon) (for example, produced by diffusion or implantation).

Said gate terminals 240, 244, 245, 247, and 273 may comprise aluminum or doped polysilicon. The gate terminals 240, 244, 245, 247 and 273 are relatively thin with respect to the doped regions of the semiconductor substrate and are therefore also to be associated with the first (lower) arrangement plane in accordance with FIG. 11.

FIG. 12 shows, in a top plan view corresponding to FIG. 11, additional elements of the pixel 11 that are arranged as metallizations in a second plane. This second plane extends above the first plane in accordance with FIG. 11 and is offset in parallel from it in the vertical direction. The elements of the first plane in accordance with FIG. 11 that are present under the metallizations are furthermore visible. The metallizations (e.g. aluminum or aluminum alloy) may, for example, be produced by evaporation or sputtering and by a subsequent exposure by etching. The metallizations in accordance with FIG. 12 may be separated in the vertical direction from the first plane in accordance with FIG. 11 by an electrical insulator or a dielectric (e.g. a silicon dioxide). The semiconductor substrate, the electrical insulator, and the metallizations may form a sequence of layers that are disposed above one another in an integrally bonded manner.

The metallizations shown in FIG. 12 (shown darkly hatched) form electrical contacts, connections, and capacitors. A contact region 340 for the gate terminal 240 of the transfer gate 39; a contact region 347 for the gate terminal 247 of the selection switch 47; a contact region 317 for the column line 17; a contact region 345 for the gate terminal 245 of the reset switch 45; a contact region 371 for connecting the overflow capacitor 71 (not shown in FIGS. 11 and 12); a contact region 373 for the gate terminal 273 of the further transfer gate 73; a contact track 351 that connects the two terminals VDD for the supply voltage 51 in accordance with FIG. 11; and a contact region 352 for the ground line GND can be seen. Said metallizations in accordance with FIG. 12 may be electrically connected to the associated elements in accordance with FIG. 11 via vertical vias, i.e. via metal tracks that extend through the electrical insulator (e.g. silicon dioxide) perpendicular to the first, lower plane in accordance with FIG. 11 and the second, upper plane in accordance with FIG. 12.

The readout node 41 of the pixel 11 in accordance with FIGS. 11 and 12 comprises a bridge section 341 that connects the output of the transfer gate 39 to the gate terminal 244 of the converter transistor 43. The bridge section 341 extends a metal track in the second, upper plane of the pixel 11 in accordance with FIG. 12 and crosses the signal output 44 of the converter transistor 43 and the output line 144. A first end of the bridge section 341 is electrically connected to the output of the transfer gate 39 via a first metallic via, which again extends perpendicular to the first and second planes of the pixel 11, and a second end of the bridge section is electrically connected to the gate terminal 244 of the converter transistor 43 via a second metallic via that again extends perpendicular to the first and second planes of the pixel 11 (see the designations FD in FIG. 12).

The shielding structure 61 of the pixel 11 in accordance with FIGS. 11 and 12 comprises a shielding section 361 that extends in the second, upper plane of the pixel 11 in accordance with FIG. 12. The shielding section 361 surrounds the bridge section 341 of the readout node 41 in the form of a circumferentially closed ring that extends in the same plane as the bridge section 341. The shielding section 361 partly covers the output of the transfer gate 39, the signal output 44 of the converter transistor 43, and the output line 144. The shielding section 361 is formed by a metal track and is electrically connected via a third metallic via, which again extends perpendicular to the first and second planes of the pixel 11, to the signal output 44 of the converter transistor 43 or to the output line 144 that connects the signal output 44 to the selection switch 47. This third metallic via thus forms the already mentioned connection line 63 that connects a part of the shielding structure 61, namely the shielding section 361, to the signal output 44 of the converter transistor 43 or to the output line 144, and indeed in the vertical direction. Since the first plane and the second plane of the pixel 11 extend at a small spacing from one another (approximately in the order of magnitude of the horizontal extent of the pixel 11), the (vertical) connection line 63 is relatively short in this embodiment.

The shielding structure 61 and in particular the shielding section 361 are hereby set to an electrical potential that depends on the voltage signal of the converter transistor 43. With respect to a path of minimum length that may be drawn from the output of the transfer gate 39 to the gate terminal 244 of the converter transistor 43 (cf. FIG. 12), the annular shielding section 361 surrounds more than half of this path, namely the total bridge section 341 extending in the second, upper plane.

Due to the arrangement of the components of the pixel 11 shown in FIGS. 11 and 12, a small extent of the readout node 41 may be achieved with a correspondingly small capacitance. The transfer gate 39 and the converter transistor 43 may be arranged at a short spacing from one another in a common plane of the pixel 11 (first plane in accordance with FIG. 11). Since the bridge section 341 of the readout node 41, and thus a substantial part of the readout node 41, is laterally surrounded by the annular shielding section 361 and the latter is set to the electrical potential at the signal output 44 of the converter transistor 43, the effective capacitance of the readout node 41 is reduced. A further reduction of the effective capacitance of the readout node 41 is achieved in that the bridge section 341 of the readout node 41 crosses the signal output 44 of the converter transistor 43 and the output line 144, and in that the signal output 44 of the converter transistor 43 and the output line 144 connected thereto thus act as an additional part of the shielding structure 61 that partly surrounds the bridge section 341 of the readout node 41 at its lower side.

Even a further reduction of the effective capacitance of the readout node 41 is achieved in that the shielding structure 61 comprises further shielding sections 261 that extend in the first, lower plane of the pixel 11 in accordance with FIG. 11 adjacent to the converter transistor 43. The further shielding sections 261 may also be formed by a doping of the semiconductor substrate used like the signal output 44 of the converter transistor 43 and the output line 144. The further shielding sections 261 form the shape of a respective finger that projects away from the signal output 44 of the converter transistor 43 in a straight line or in a curved manner with a free end.

In the embodiment example shown in FIG. 11, the respective further shielding section 261 extends in parallel with and closely adjacent to the current passage 243 of the converter transistor 43 (cf. FIG. 11). The two further shielding sections 261 and the signal output 44 of the converter transistor 43 thus together form a C shape that surrounds the converter transistor 43 and in particular its current passage 243 and its gate terminal 2414 at three sides. The respective further shielding section 261 furthermore extends offset in parallel from and in the same direction as a part of the annular shielding section 361 disposed in the second plane of the pixel 11 (cf. FIG. 12). A further shielding section 261 could, for example, also extend as a finger-shaped extension away from the signal output 44 of the converter transistor 43 in the direction of the transfer gate 39 (not shown in FIG. 11).

Due to the combination of these measures (annular shielding section 361 in the second, upper plane and one or more further shielding sections 261 in the first, lower plane of the pixel 11), a particularly significant reduction of the effective capacitance of the readout node 41 is achieved.

REFERENCE NUMERAL LIST 11 pixel
15, 15a, 15b light-sensitive element
17 column line
31 current source
33 cut-off switch
39 transfer gate
41 readout node
42 parasitic capacitance of the readout node
43 converter transistor
44 signal output of the converter transistor
reset switch
47 selection switch
51 supply voltage
61, 61' shielding structure
62 capacitance of the shielding structure
63, 63' connection line
66 insulating spacing
71 overflow capacitor
73 further transfer gate
113 column readout circuit
115 pre-charge circuit
127 reference value capacitor
131 amplifier
133 signal value capacitor
135 positive input
137 negative input
144 output line
147 coupling switch
149D, 149E switches
153 control device
160 decoupling circuit
162 impedance converter
163 connection line
165 ground potential
166 switch
167 capacitor
166 capacitor
171 further coupling switch
239 current passage of the transfer gate
240 gate terminal of the transfer gate
243 current passage of the converter transistor
244 gate terminal of the converter transistor
245 gate terminal of the reset switch
247 gate terminal of the selection switch
261 further shielding section of the shielding structure
273 gate terminal of the further transfer gate
317 contact region for the column line
340 contact region for the transfer gate
341 bridge section of the readout node
345 contact region for the reset switch
347 contact region for the selection switch
351 contact path for the supply voltage
352 contact region for the ground line
361 shielding section of the shielding structure
371 contact region for the overflow capacitor
373 contact region for the further transfer gate

The invention claimed is:

1. An image sensor for electronic cameras, the image sensor comprising a plurality of pixels for generating exposure-dependent signals, wherein a respective pixel of the plurality of pixels at least comprises:
   a light-sensitive element to generate electrical charge from incident light;
   a readout node;
   a transfer gate to selectively couple the light-sensitive element to the readout node;
   a converter transistor to convert a charge present at the readout node into a voltage signal at a signal output; and
   a selection switch that is connected to the signal output of the converter transistor to selectively couple the signal output of the converter transistor to an associated readout line of the image sensor,
   wherein the respective pixel has an electrically conductive shielding structure that at least partly surrounds the readout node with respect to a top plan view of the respective pixel and that is set or settable to an electrical potential that depends on the voltage signal at the signal output of the converter transistor,
   wherein the readout node comprises a bridge section that connects an output of the transfer gate to a gate terminal of the converter transistor,
   wherein the transfer gate and the converter transistor are disposed in a first plane of the pixel and the bridge section is disposed in a second plane of the pixel that is offset in parallel relative to the first plane,
   wherein the shielding structure comprises a shielding section that is disposed in the second plane of the pixel and that at least partly surrounds the bridge section.

2. The image sensor in accordance with claim 1, wherein the shielding structure is directly or indirectly connected or couplable to the signal output of the converter transistor.

3. The image sensor in accordance with claim 1, wherein the selection switch is connected to the signal output of the converter transistor of the respective pixel via an output line, and wherein the shielding structure is connected to the signal output of the converter transistor via the output line.

4. The image sensor in accordance with claim 1, wherein the shielding structure is configured to be coupled to the signal output of the converter transistor via the associated readout line of the image sensor and via the selection switch.

5. The image sensor in accordance with claim 4, wherein the shielding structure is connected or configured to be coupled to the associated readout line of the image sensor via an impedance converter.

6. The image sensor in accordance with claim 5, wherein the impedance converter is configured to amplify the voltage signal of the converter transistor.

7. The image sensor in accordance with claim 6, wherein the impedance converter is configured to amplify the voltage signal of the converter transistor with at least one of a switchable gain or a decreasing gain characteristic.

8. The image sensor in accordance with claim 1, wherein the shielding structure is configured to be directly or indirectly coupled to the signal output of the converter transistor via a coupling switch.

9. The image sensor in accordance with claim 8,
wherein the coupling switch is configured to be controlled together with the selection switch of the respective pixel.

10. The image sensor in accordance with claim 1,
wherein the shielding structure is configured to be coupled to an electrical reference potential via a further coupling switch.

11. The image sensor in accordance with claim 1,
wherein the shielding structure surrounds the readout node at at least three sides.

12. The image sensor in accordance with claim 1,
wherein the shielding structure is at least one of being circumferentially closed or being formed as an O shape.

13. The image sensor in accordance with claim 1,
wherein the shielding structure is at least one of being circumferentially open or being formed as a C shape or a U shape.

14. The image sensor in accordance with claim 1,
wherein the shielding structure extends within a plane,
wherein the shielding structure is directly or indirectly connected or couplable to the signal output of the converter transistor via a connection line, wherein at least a part of the connection line adjoining the shielding structure extends substantially perpendicular to the plane of extent of the shielding structure.

15. The image sensor in accordance with claim 1,
wherein the bridge section is connected to the output of the transfer gate via a first via that extends perpendicular to the first plane of the pixel, and wherein the bridge section is connected to the gate terminal of the converter transistor via a second via that extends perpendicular to the first plane of the pixel.

16. The image sensor in accordance with claim 1,
wherein the bridge section crosses the signal output of the converter transistor with respect to a top plan view of the respective pixel.

17. The image sensor in accordance with claim 1,
wherein a current passage of the transfer gate and a current passage of the converter transistor are formed by an electrically conductive channel of a semiconductor substrate, and wherein the bridge section is formed by a metal track on the semiconductor substrate.

18. The image sensor in accordance with claim 17,
wherein the image sensor is configured as a back side illuminated image sensor, wherein the first plane of the pixel is formed by the semiconductor substrate and the second plane of the pixel is formed by the metal track, wherein the first plane of the pixel and the second plane of the pixel are separated from one another by a layer of an electrical insulator.

19. The image sensor in accordance with claim 1,
wherein the shielding section forms a circumferentially closed ring that surrounds the bridge section within the second plane of the pixel.

20. The image sensor in accordance with claim 1,
wherein the shielding section at least partly covers the output of the transfer gate and the signal output of the converter transistor.

21. The image sensor in accordance with claim 1,
wherein the shielding section is connected to the signal output of the converter transistor via a third via that extends perpendicular to the first plane of the pixel.

22. The image sensor in accordance with claim 1,
wherein the shielding structure comprises a further shielding section that is disposed in the first plane of the pixel and that is arranged adjacent to at least one of the transfer gate or to the converter transistor.

23. The image sensor in accordance with claim 22,
wherein the further shielding section forms an elongate finger that has a free end.

24. The image sensor in accordance with claim 22,
wherein the further shielding section extends in parallel with a current passage of the converter transistor.

25. The image sensor in accordance with claim 22,
wherein the further shielding section extends offset in parallel from and in the same direction as a part of the shielding section disposed in the second plane of the pixel.

26. The image sensor in accordance with claim 1,
wherein the shielding structure surrounds more than half of a path of minimum length that extends from an output of the transfer gate to an input of the converter transistor.

27. The image sensor in accordance with claim 1,
wherein the respective pixel further comprises at least one of:
a reset switch to selectively couple the readout node to a reset potential or
an overflow capacitor and a further transfer gate to selectively couple the readout node to the overflow capacitor.

* * * * *